US005298075A

United States Patent [19]
Lagendijk et al.

[11] Patent Number: 5,298,075
[45] Date of Patent: Mar. 29, 1994

[54] FURNACE TUBE CLEANING PROCESS

[75] Inventors: André Lagendijk, Oceanside; Arthur K. Hochberg, Selana Beach; David A. Roberts, Carlsbad, all of Calif.

[73] Assignee: Air Products and Chemicals, Inc., Allentown, Pa.

[21] Appl. No.: 98,496

[22] Filed: Jul. 28, 1993

Related U.S. Application Data

[62] Division of Ser. No. 898,857, Jun. 15, 1992.

[51] Int. Cl.$^5$ .................................................. B08B 9/00
[52] U.S. Cl. ........................................ 134/2; 134/22.1; 134/22.11
[58] Field of Search ................... 134/2, 22.1, 22.11

[56] References Cited

U.S. PATENT DOCUMENTS

| 3,837,905 | 9/1974 | Hile et al. | 437/239 |
| 4,563,367 | 1/1986 | Sherman | 427/39 |

FOREIGN PATENT DOCUMENTS

| 63-269548 | 11/1988 | Japan | 437/239 |

*Primary Examiner*—R. Bruce Breneman
*Assistant Examiner*—Zeinab El-Arini
*Attorney, Agent, or Firm*—James C. Simmons; William F. Marsh

[57] ABSTRACT

A process for thermal oxidation of silicon or cleaning of furnace tubes used in semiconductor manufacturing by exposing the silicon or tube to temperatures above 700° C. while flowing a carrier gas containing oxygen and a chlorohydrocarbon having a general formula $C_xH_xCl_x$ where x is 2, 3, or 4 over the silicon or tube. The chlorohydrocarbon is selected to readily and completely oxidize at temperature.

5 Claims, 3 Drawing Sheets

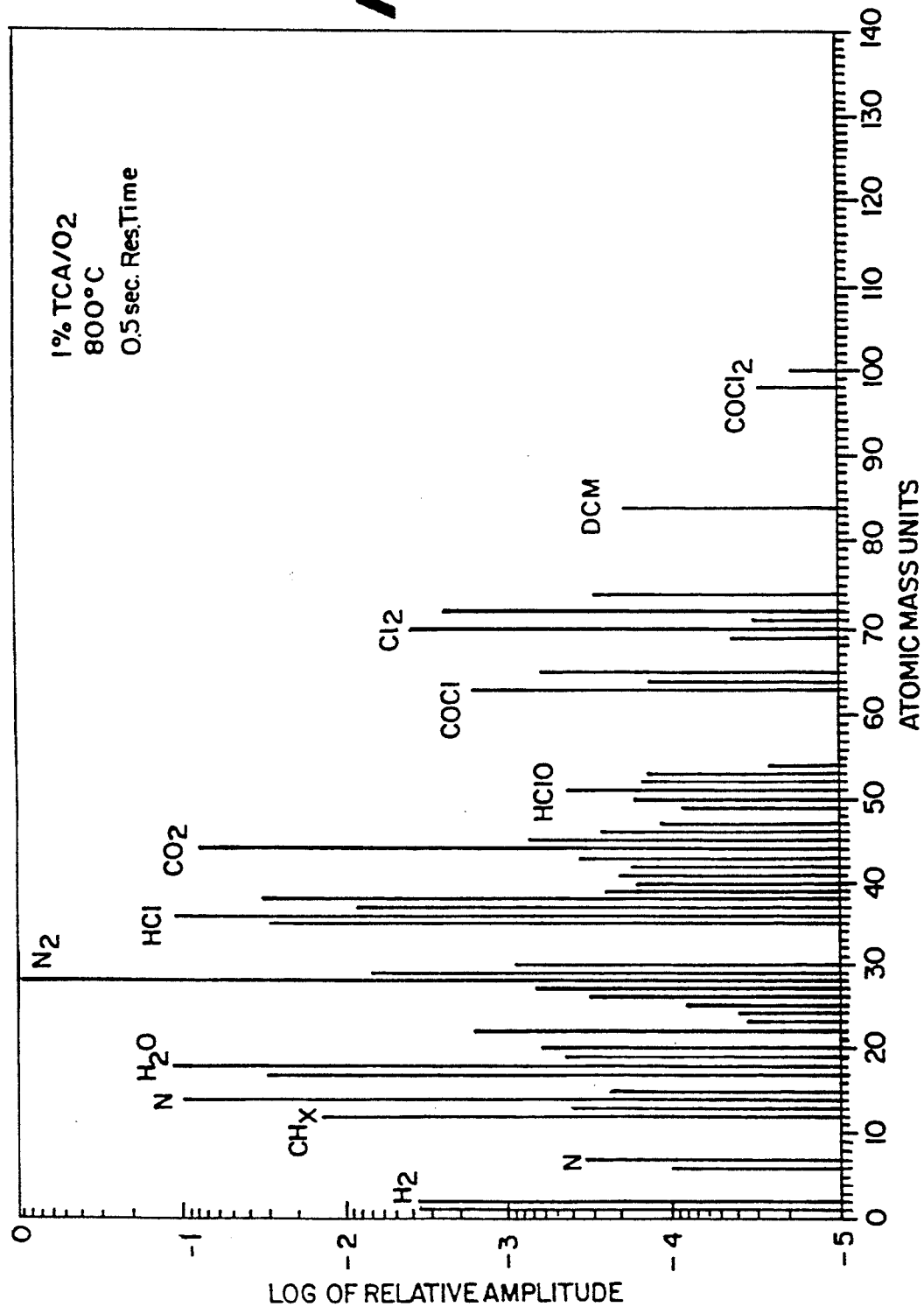

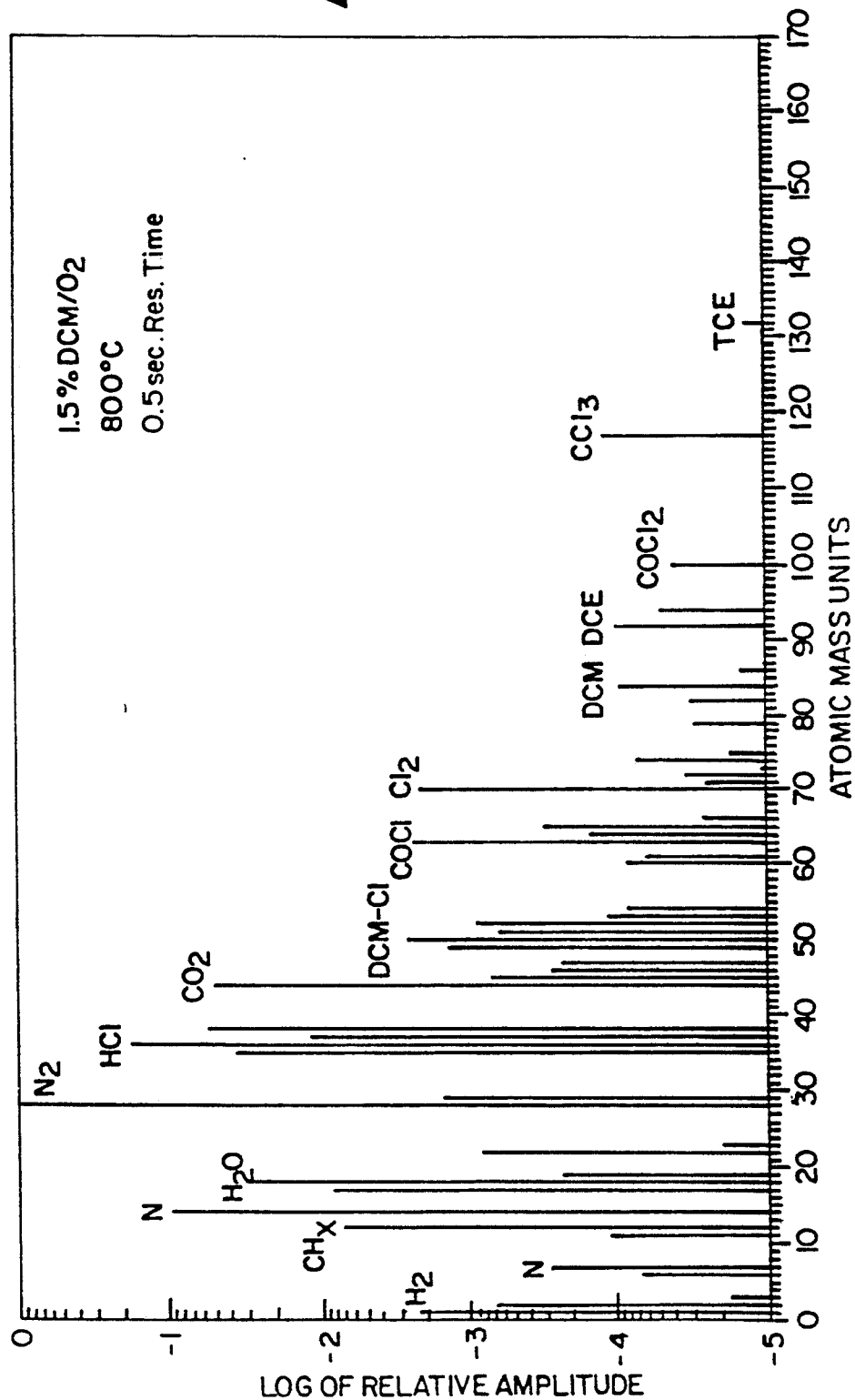

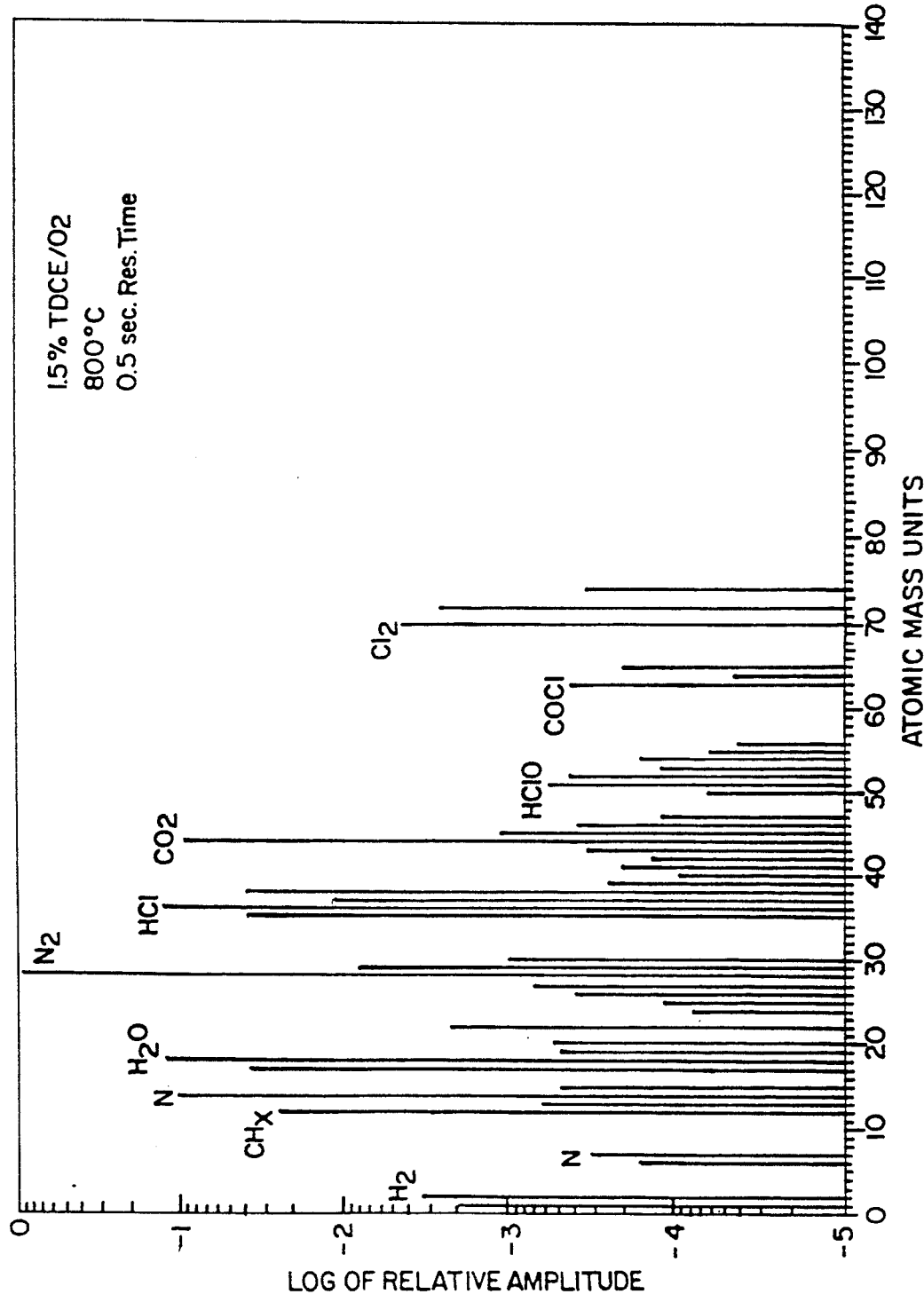

FURNACE TUBE CLEANING PROCESS

This is a division, of application Ser. No. 07/898,857 filed Jun. 15, 1992.

FIELD OF THE INVENTION

The present invention pertains to chlorine sources widely used for thermal oxidation of silicon during the manufacture of semiconductor devices.

BACKGROUND OF THE INVENTION

In the manufacture of integrated circuits, thermal oxidation of silicon is one of the key process steps. Modern processes utilize a small amount of chlorine-bearing vapor (HCl or $Cl_2$, etc.) along with the oxidant in a carrier gas to enhance the properties of the oxide. The chlorine species getters metallic species (e.g. Na, Fe) in the environment by conversion to a chloride which is carried out as a vapor in the carrier gas exiting the furnace or forms chloride in the oxide thus preventing migration of metallic species. This stabilizes electrical properties of the oxide. Chlorine addition also changes the growth kinetics of the oxide.

One of the more widely used chlorine sources for this process is 1,1,1-trichloroethane (TCA) packaged and sold by the Schumacher unit of Air Products and Chemicals, Inc., Carlsbad, CA. The TCA chlorine source is flowed into a manufacturing furnace in a carrier gas such as nitrogen together with an oxygen source. The silicon article is heated to a temperature in excess of 800° C. to oxidize the hydrocarbon to form high purity hydrogen chloride according to the equation:

$$C_2H_3Cl_3 + XO_2 \rightarrow 3HCl = 2CO_2 = (x-2)O_2$$

An excess amount of oxygen is used to prevent formation of carbon by conversion of the carbon to carbon dioxide. Using an excess of oxygen prevents the starvation of the reaction for oxygen thereby converting all of the TCA to HCl and $CO_2$. This also prevents chance formation of phosgene, a dangerous gas. Argon may be used in place of nitrogen as the carrier gas.

The TCA can be used in a like manner to clean furnace tubes used in the production of semiconductor devices. Here the quartz tube is held at an elevated temperature with oxygen or steam and a chlorine source flowed through the tube. The chlorine generated reacts with metal contaminates producing volatile metal chlorides and these chlorides are exhausted from the tube with the gas flow. If such metals were allowed to remain in the tube during silicon oxidation, they may create significant defects in the silicon. This result is similar to that in silicon oxidation where such contaminants on or near the surface of the silicon wafers are volatilized or made immobile in the growing oxide. Chlorine sources used in the more critical silicon oxidation are suitable for the less demanding tube cleaning.

TCA has replaced HCl gas since the latter is highly corrosive and has caused extensive damage to facilities and to device yields. TCA produces the same reaction products in the same proportions as HCl gas in a hot oxidizing environment. This is critical to the silicon oxidation process since it allows substitution of TCA for HCl gas without extensive experimentation.

Other chlorine sources have been evaluated. Dichloroethane and, especially, 1,1,2 trichloroethylene have been described in the art as sources of HCl for the chloroxidation of silicon (e.g. R. G. Cosway, S. Wu J. Electronics Soc., 1985, 132, p. 151; C. L. Claeys et al J. Appl. Phys., 1980, 51, p. 6183; and T. Hattori, Solid State Tech, 1982, July p.83) but, as taught by E. J. Janssens, G. J. Declerck, (d. Electrochem Soc, 1978, 125, 1697), the performance of the precursors is best for compounds where the number of hydrogens equals the number of chlorines. The trichloroethylene, for example, generates an excess of diatomic chorine when it decomposes, resulting in excessive etching of the silicon substrate during the oxidation. In addition, 1,1,2 trichloroethylene is highly toxic as is carbon tetrachloride a source for $Cl_2$ described by C. M. Osborn (J. Electrochem. Soc., 1974, 121, p. 809). danssens et al go on to cite methylene chloride, 1,1,2 trichloroethane and 1,1,1 trichloroethane as possible precursors where the number of hydrogens equals the number of chlorines. However, they conclude on the basis of comparative volatilities, chemical stability, commercial availability, and toxicity that the 1,1,1 trichloroethane is the best candidate. Both the 1,1,2 trichloroethane (tlv 10 ppm) and methylene chloride are regarded as toxic and carcinogenic in animal tests. In addition we have found no significant performance advantage of dichloromethane relative to 1,1,1 trichloroethane in chloroxidation experiments on silicon substrates.

The use of TCA as an HCl source and its application is widely practiced in the semiconductor industry. The typical process is similar to that described in S. Wolf, R. N. Tauber, Silicon Processing for the VLSI Era, Volume I, Lattice Press 1986, p 215-216, where the temperature would be greater than or equal to 850° C. The thermodynamic studies of Janssens et al have demonstrated that oxidation of TCA should be complete even at 700° C., however, it has been reported that the gas phase composition of TCA at 800° C. is not at the equilibrium composition under conditions similar to those practiced in the chloroxidation process (J. R. Flemish, R. E. Tressler, J. R. Monkowski J. Electrochem Soc., 1988, 135, 1192).

Current oxidations are carried out at temperatures greater than 800° C. The need for more demanding control over the thickness and quality of thermally grown oxides requires a reduction in the temperature under which the reaction is carried out. The high stability of TCA becomes a disadvantage as the temperature declines, because of the risk of incomplete combustion resulting in the incorporation of carbon in the growing oxide films.

Although TCA has been a useful additive for both chloroxidations and tube cleaning, new trends in processing conditions towards lower temperatures as well as environmental concerns have turned the high chemical stability of TCA into a disadvantage. The high stability of the compound upon environmental exposure is advantageous in the handling of the material, but ensures that the compound is able to reach the upper atmosphere before it decomposes. Breakdown results in the generation of free chlorine radicals which can destroy the earth's protective ozone layer. TCA is currently being phased out for all nonfeedstock commercial applications in the United States by the Environmental Protection Agency.

SUMMARY OF THE INVENTION

It has been discovered that chlorocarbons of the general formula $C_xH_xCl_x$ where x is 2, 3, or 4 are surprisingly efficacious in the chloroxidation of silicon. Compounds with this formulation breakdown efficiently at temperatures at least as low as 800° C. to give high quality silicon oxides with low carbon incorporation. In addition, these compounds are far less detrimental to the earth's ozone layer than TCA. Also, such compounds are direct replacements for TCA/HCl since they produce HCl and $H_2O$ in the same proportions as those produced by HCl gas and TCA in the hot oxidizing environment.

BRIEF DESCRIPTION OF THE DRAWINGS

FIG. 1 is a plot of the Log of Relative Amplitude against atomic mass units for $TCA/O_2$ reaction at 800° C.

FIG. 2 is a plot of the Log of Relative Amplitude against atomic mass units for $DCM/O_2$ reaction at 800° C.

FIG. 3 is a plot of the Log of Relative Amplitude against atomic mass units for $TDCE/O_2$ reaction at 800° C.

DETAILED DESCRIPTION OF THE INVENTION

In the search for TCA substitutes we discovered that compounds of the form $C_xH_xCl_x$ where $x=2, 3,$ or $4$ are oxidized to the desired products HCl, $Cl_2$, and $H_2O$ at lower temperatures with less detrimental carbon compounds than are saturated chlorohydrocarbons of the form $C_xH_yCl_y$, where $x=1,2$ and $Y=X+1$. An equilibrium thermodynamic analysis of many of these compounds shows that $C_xH_xCl_x$ where $x=2, 3, 4$ and $C_xH_yCl_y$, where $X=1,2$ and $Y=X+1$ should have equivalent products. However, our kinetic studies show the superiority of the unsaturated compounds. The thermodynamic and kinetic results are summarized below.

The results of equilibrium thermodynamic calculations for HCl and TCA in oxygen show that identical products with similar proportions are generated by both chlorine species. Species used in the thermodynamic calculations for $TCA/O_2$ are shown in Table I. Only the species with asterisks were used for $HCl/O_2$.

TABLE I

| Species Used in Thermodynamic Calculations | | | |
|---|---|---|---|
| C | CCl | $C_2HCl$ | *HOCl |
| $C_2H$ | $CCl_2$ | COCl | *$Cl_2$ |
| $C_2H_2$ | $CCl_3$ | $COCl_2$ | *ClO |
| $C_2H_4$ | $CCl_4$ | *H | *$ClO_2$ |
| CO | $C_2Cl_2$ | *$H_2$ | *$Cl_2O$ |
| $CO_2$ | $C_2Cl_4$ | *HO | *$O_2$ |
| $C_2O$ | CHCl | *$HO_2$ | *$O_3$ |
| $C_3O_2$ | $CHCl_3$ | *$H_2O$ | |
| CHO | $CH_2Cl_2$ | *$H_2O_2$ | |
| $CH_2O$ | $CH_3Cl$ | *HCl | |

*Species used in H— Cl —O system.

Table II below shows that 1% TCA in oxygen is equivalent to 3% HCl in oxygen at temperatures from 700° to 1300° C. with respect to partial pressures of the products. For example, at 700° C. the partial pressure of HCl produced by oxidation of TCA is 99.3% of that resulting from replacing 1% TCA with 3% HCl gas.

TABLE II

| COMPARISON OF 1% TCA (at 20° C.) WITH 3% HCl | | | | | |
|---|---|---|---|---|---|
| TEMP | PARTIAL PRESSURE RATIOS OF SPECIES (FROM TCA/FROM HCl) | | | | |
| (°C.) | HCl | $O_2$ | $H_2O$ | $Cl_2$ | ClOH |
| 700 | 0.993 | 0.913 | 0.971 | 0.971 | 0.949 |
| 800 | 0.991 | 0.913 | 0.969 | 0.969 | 0.947 |
| 900 | 0.989 | 0.913 | 0.967 | 0.967 | 0.946 |
| 1000 | 0.988 | 0.913 | 0.966 | 0.966 | 0.944 |
| 1100 | 0.987 | 0.913 | 0.965 | 0.965 | 0.943 |
| 1200 | 0.986 | 0.914 | 0.964 | 0.964 | 0.943 |
| 1300 | 0.986 | 0.914 | 0.964 | 0.964 | 0.942 |

Table III below shows the same results using mole ratios of products.

TABLE III

| COMPARISON OF 1% TCA (AT 20° C.) WITH 3% HCl | | | | | |
|---|---|---|---|---|---|
| TEMP | MOLE RATIOS OF SPECIES (FROM TCA/FROM HCl) | | | | |
| (°C.) | HCl | $O_2$ | $H_2O$ | $Cl_2$ | ClOH |
| 700 | 1.013 | 0.942 | 0.990 | 0.990 | 0.968 |
| 800 | 1.011 | 0.942 | 0.988 | 0.988 | 0.966 |
| 900 | 1.009 | 0.942 | 0.987 | 0.987 | 0.965 |
| 1000 | 1.008 | 0.942 | 0.985 | 0.985 | 0.963 |
| 1100 | 1.007 | 0.942 | 0.985 | 0.985 | 0.962 |
| 1200 | 1.006 | 0.942 | 0.983 | 0.984 | 0.962 |
| 1300 | 1.006 | 0.942 | 0.981 | 0.983 | 0.961 |

Table IV below shows processing data used as input to the thermodynamic calculation program.

TABLE IV

| PROCESS SPECIFICATIONS FOR 3 (SLPM) TOTAL FLOW | | | | | | |
|---|---|---|---|---|---|---|
| Source | Source Temp °C. | Vapor Press Torr | Atoms/molecules | | | $N_2$ carrier required sccm | Source Vol. % |
| | | | C | H | Cl | | |
| HCl | — | — | 0 | 1 | 1 | — | 3 |
| TCA | 20 | 100 | 2 | 3 | 3 | 198 | 1 |
| DCM | 20 | 335 | 1 | 2 | 2 | 57 | 1.5 |
| TDCE | 0 | 100 | 2 | 2 | 2 | 169 | 1.5 |
| 4CP | 50 | 19.5 | 3 | 4 | 4 | 855 | 0.75 |
| TCP | 50 | 100 | 3 | 5 | 3 | 198 | 1 |
| DCE | 30 | 100 | 2 | 4 | 2 | 297 | 1.5 |
| DCP | 39 | 100 | 3 | 6 | 2 | 297 | 1.5 |
| NPC | 20 | 275 | 3 | 7 | 1 | 159 | 3 |

The chlorine source abbreviations are explained below in relation to Table V. The H to Cl ratios in the compounds studied ranged from 1:1 to 7:1.

TABLE V

| ANALYSIS OF EQUILIBRIUM MOLES OF SEVERAL SPECIES GENERATED BY THE OXIDATION OF ORGANIC CHLORINE SOURCES | | | | | | | | |
|---|---|---|---|---|---|---|---|---|
| TEMP °C. | Relative number of moles of HCl from[1] | | | | | | | |
| | TCA[2] | DCM[2] | TDCE[2] | 4CP[2] | TCP[2] | DCE[2] | DCP[2] | NPC[2] |
| 700 | 1.013 | 1.005 | 1.018 | 1.052 | 1.278 | 1.377 | 1.576 | 1.906 |
| 800 | 1.011 | 1.004 | 1.011 | 1.044 | 1.262 | 1.348 | 1.506 | 1.724 |
| 900 | 1.009 | 1.004 | 1.009 | 1.038 | 1.245 | 1.314 | 1.441 | 1.585 |
| 1000 | 1.008 | 1.003 | 1.008 | 1.032 | 1.229 | 1.290 | 1.384 | 1.481 |
| 1100 | 1.007 | 1.003 | 1.007 | 1.028 | 1.214 | 1.264 | 1.337 | 1.404 |
| TEMP | Relative number of moles of $Cl_2$ from | | | | | | | |

TABLE V-continued

ANALYSIS OF EQUILIBRIUM MOLES OF SEVERAL SPECIES
GENERATED BY THE OXIDATION OF ORGANIC
CHLORINE SOURCES

| °C. | TCA | DCM | TDCE | 4CP | TCP | DCE | DCP | NPC |
|---|---|---|---|---|---|---|---|---|
| 700 | 0.990 | 0.996 | 0.990 | 0.959 | 0.783 | 0.705 | 0.549 | 0.291 |
| 800 | 0.988 | 0.996 | 0.988 | 0.952 | 0.713 | 0.618 | 0.444 | 0.205 |
| 900 | 0.987 | 0.995 | 0.987 | 0.946 | 0.643 | 0.537 | 0.358 | 0.148 |
| 1000 | 0.985 | 0.994 | 0.987 | 0.946 | 0.577 | 0.465 | 0.291 | 0.112 |
| 1100 | 0.985 | 0.994 | 0.984 | 0.937 | 0.518 | 0.404 | 0.241 | 0.088 |
| TEMP | Relative number of moles of $Cl_2/H_2O$ from | | | | | | | |
| °C. | TCA | DCM | TDCE | 4CP | TCP | DCE | DCP | NPC |
| 700 | ←— Same as $Cl_2$ —→ | | | | 1.971 | 2.488 | 4.115 | 10.99 |
| 800 | | | | | 2.113 | 2.717 | 4.642 | 12.80 |
| 900 | | | | | 2.280 | 2.993 | 5.270 | 14.88 |
| 1000 | | | | | 2.474 | 3.310 | 5.981 | 17.18 |
| 1100 | | | | | 2.689 | 3.661 | 6.755 | 19.63 |
| TEMP | Relative number of moles of $O_2$ after reaction with | | | | | | | |
| °C. | TCA | DCM | TDCE | 4CP | TCP | DCE | DCP | NPC |
| 700–1100 | 0.932 | 0.980 | 0.926 | 0.705 | 0.917 | 0.876 | 0.853 | 0.808 |

(1) Values given are relative to the moles of species produced by a 3% HCl process.
(2) TCA - 1,1,1-trichloroethane
DCM - Methylene Chloride
TDCE - trans-1,2-dichloroethylene
4CP - 1,1,1,2-tetrachloropropane
DCE - 1,2-dichloroethane
TCP - 1,1,1-trichloropropane
DCP - 1,2-dichloropropane
NPC - n-propylchloride (1-chloropropane)

Table V shows the results from the equilibrium thermodynamic calculations for the different chlorine sources. Each source input provided the same mole input of chlorine as a 3% HCl process. TCA, DCM, and TDCE produce similar numbers of moles of HCl, $CL_2$, and $H_2O$ as from the HCl source. 4CP, also with H equal to Cl, produces products with 3 to 5% differences from TCA. The relative number of moles of oxygen is not as important since there is a high excess of oxygen in each process.

The oxidation of silicon in a furnace tube is an equilibrium process at high temperatures. However, at lower temperatures (8000C or less) there may be incomplete conversions of chlorine sources to the desired products. A kinetic study showed that the sources were not equivalent for short reaction times.

The study was conducted in a small furnace tube with gas flows and temperature zones chosen to produce a 0.5 second reaction time. The input to a residual gas analyzer (RGA) was located downstream from the reaction zone. Spectra were recorded with and without the chlorine source. The difference spectra were normalized to the nitrogen partial pressure; nitrogen was used as the carrier gas to transport the chlorine sources into the reactor.

The results for 800° C. are shown in FIGS. 1, 2, and 3 for TCA, DCM, and TDCE, respectively. At this temperature TDCE is superior to DCM and even TCA in providing the desired reaction products while eliminating all heavier hydrocarbon species. These species could contaminate the growing silicon oxide. Table VI below shows the percentage of heavy atomic mass unit (AMU) partial pressures relative to HCl in the reactions. Neither this table nor the figures have been corrected for detector sensitivities. Such corrections would increase the relative abundances of high AMU species.

TABLE VI

| Relative percentages of high AMU species | | | |
|---|---|---|---|
| | Relative percentage from | | |
| AMU | TCA | DCM | TDCE |
| 132 | nd(1) | 0.0075 | nd |
| 117 | nd | 0.061 | nd |
| 100 | 0.018 | 0.022 | nd |
| 98 | 0.027 | nd | nd |
| 92 | nd | 0.055 | nd |
| 84 | 0.18 | 0.53 | nd |

(1) Not detected.

According to the present invention, 150 mm diameter p-(100) single crystal silicon wafers were oxidized in a quartz furnace held at 800° C. in an excess of oxygen with the chlorohydrocarbon carried into the furnace by a carrier gas, e.g., nitrogen. An equivalent of 3% hydrogen chloride (HCl) was added to the oxidizing atmosphere, the chlorine source being in one part of the example 1,1,1,-trichloroethane (TCA) and in the other part of the experiment trans-1,2-dichloroethylene (TDCE $CH_2Cl=CH_2Cl$). The experiment was carried on until high integrity oxides at least 100Å thick were prepared.

Physical properties of the oxides were evaluated by ellipsometry, total x-ray fluorescence, spectrometry, secondary ion mass spectrometry, and vapor phase decomposition - atomic absorption spectroscopy. Electrical properties were determined by capacitance-voltage, surface charge analysis, and microwave photoconductivity decay.

These studies established the average oxide morphology, fixed charge and interface state characteristics, and heavy metal contamination. Both TCA and TDCE sources produced films with similar values of $Q_{ox}$ from 0.7 to $1.2 \times 10^{11}$ cm-2. The oxide growth rates for both chemicals were identical. The most significant difference in film properties was a lower defect density of 0.2/cm² for TDCE vs. 0.8/cm² for TCA processes. This implies that device yields would improve if TDCE replaced TCA.

TDCE and TCA were evaluated in a similar manner at 920° and 1000° C. on p-(100) silicon wafers. Using 3% equivalent HCL, films were grown with thicknesses in the range of 120 to 250Å.

There were slight differences in oxide growth rates using the two chemicals with the TDCE growth rates being 4% and 1% greater than the TCA rates at 920° C. and 1000° C. respectively. These differences are small and may be caused by slight differences in the delivery systems. Delivering chemicals by bubbling through high vapor pressure liquids is an inexact procedure. A slightly high chemical container headspace pressure (a few torr) or a slightly lower temperature (1° C.) will decrease the chemical delivery by 1%. However, these results established that the performance of TDCE at the higher temperatures is equivalent to or better than TCA.

A second group of wafers had oxides grown in the thickness range of 300 to 600Å. Within experimental errors, the electrical properties of these oxides were identical. The $Q_{ss}$ values ranged from 1.4 to $1.8 \times 10^{11}$ cm $^{-2}$. The films had field strengths of 10 to $12 \times 10^6$ V/cm. The TDCE films had 10% higher field strengths than TCA films grown at 920° and 1000° C. However, this difference is close to the experimental error, so the actual improvement using TDCE may be less than 10%. These films are acceptable for silicon integrated circuits.

An analysis of the thermodynamic data suggests that most chlorocarbons would be completely decomposed to $CO_2$ and various hydrogen, oxygen and chlorine containing species at temperatures as low as 700° C. However, an analysis of the kinetic data suggests that equal numbers of hydrogen and chlorines is not sufficient to guarantee an effective HCl source under conditions which are controlled by the rate of decomposition of the precursor. Wafer processing is typically carried out in a quartz tube reactor in which the process gases are introduced at one end of the tube and drawn past the wafers as the gases flow down the tube and out the exhaust end. During the actual use of the precursors, incomplete combustion at reduced temperatures could result in the incorporation of carbon species into the films. Indeed, as illustrated in the above examples, there are performance advantages associated with the trans dichloroethylene which are reflected in the superior electrical properties of films grown with this source.

While not wishing to be bound by theory, one might speculate that the unsaturation in the trans-dichloroethylene i.e. the carbon-carbon double bond, has rendered it more sensitive to oxidation. This sensitivity has another major advantage regarding the actual application of this material in the electronics industry. For example, the trans-dichloroethane, the preferred embodiment of the invention is known to have a half life of only 3 days in the environment. This is in contrast to a half life of six (6) years for TCA. This sensitivity ensures that the release of this material into the atmosphere will have a significantly reduced effect upon the destruction of the ozone layer since it will be readily decomposed before it reaches the higher altitudes.

Having thus described our invention what is desired to be secured by Letters Patent of the United States is set forth in the appended claims.

We claim:

1. A process for cleaning furnace tubes used in the manufacture of semiconductor devices comprising the steps of:

heating the furnace tube to a temperature in excess of 800° C.;

flowing a gaseous mixture of oxygen and a chlorohydrocarbon having the general formula $C_xH_xCl_x$ wherein x is 2, 3 or 4 in a carrier gas through said tube, said chlorohydrocarbon being selected based upon its being readily and completely oxidized under the stated conditions; and maintaining said tube at temperature and in contact with said mixture in said carrier gas until said tube is sufficiently clean.

2. A process according to claim 1 wherein said chlorohydrocarbon is trans-dichloroethylene.

3. A process according to claim 1 wherein said chlorohydrocarbon is cis-dichloroethylene.

4. A process according to claim 1 wherein said chlorohydrocarbon is 1,1-dichloroethylene.

5. A process according to claim 1 wherein said chlorohydrocarbon is selected from the group consisting of trans-dichloroethylene, cis-dichloroethylene, 1,1-dichloroethylene and mixtures thereof.

* * * * *